(12) United States Patent
Yuki

(10) Patent No.: US 7,675,229 B2
(45) Date of Patent: Mar. 9, 2010

(54) SELF-EMISSION PANEL AND METHOD OF FABRICATING THE SAME

(75) Inventor: Toshinao Yuki, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 725 days.

(21) Appl. No.: 11/542,141

(22) Filed: Oct. 4, 2006

(65) Prior Publication Data
US 2007/0075625 A1 Apr. 5, 2007

(30) Foreign Application Priority Data
Oct. 4, 2005 (JP) ............................. 2005-291353

(51) Int. Cl.
H01J 1/62 (2006.01)
(52) U.S. Cl. ............................. 313/505; 257/72; 445/24
(58) Field of Classification Search ................. 313/505; 445/24; 257/74
See application file for complete search history.

(56) References Cited
U.S. PATENT DOCUMENTS
6,525,467 B1 * 2/2003 Eida et al. ................... 313/506
7,105,999 B2 * 9/2006 Park et al. ................... 313/505
7,132,801 B2 * 11/2006 Park et al. ................... 313/506
7,339,193 B2 * 3/2008 Park ............................. 257/72
2004/0004432 A1 * 1/2004 Park et al. ................... 313/504
2004/0100191 A1 * 5/2004 Park ............................. 313/506
2005/0161740 A1 * 7/2005 Park et al. ................... 257/347

FOREIGN PATENT DOCUMENTS
WO 00/60907 A1 10/2000

* cited by examiner

Primary Examiner—Peter Macchiarolo

(57) ABSTRACT

The objects of the present invention are to provide a self-emission panel capable of achieving low electrical resistance of upper electrodes by a simple configuration, and to provide a method of fabricating a self-emission panel capable of achieving low electrical resistance of upper electrodes by a simple process. A self-emission panel includes one or more self-emission elements, each of the self-emission elements has a first electrode (lower electrode) formed on a substrate directly or through other layers, a deposition layer (luminescent functional layer) including a luminescent layer formed on the first electrode (lower electrode), and a second electrode (upper electrode) formed on the deposition layer. A sealing member for sealing the self-emission elements has an opposing substrate with protrusions formed toward the substrate on the side facing the substrate. Conductive layers (wiring patterns) are formed on the protrusions as auxiliary wirings and electrically connected with the second electrodes (upper electrode.

4 Claims, 9 Drawing Sheets

PRIOR ART

10

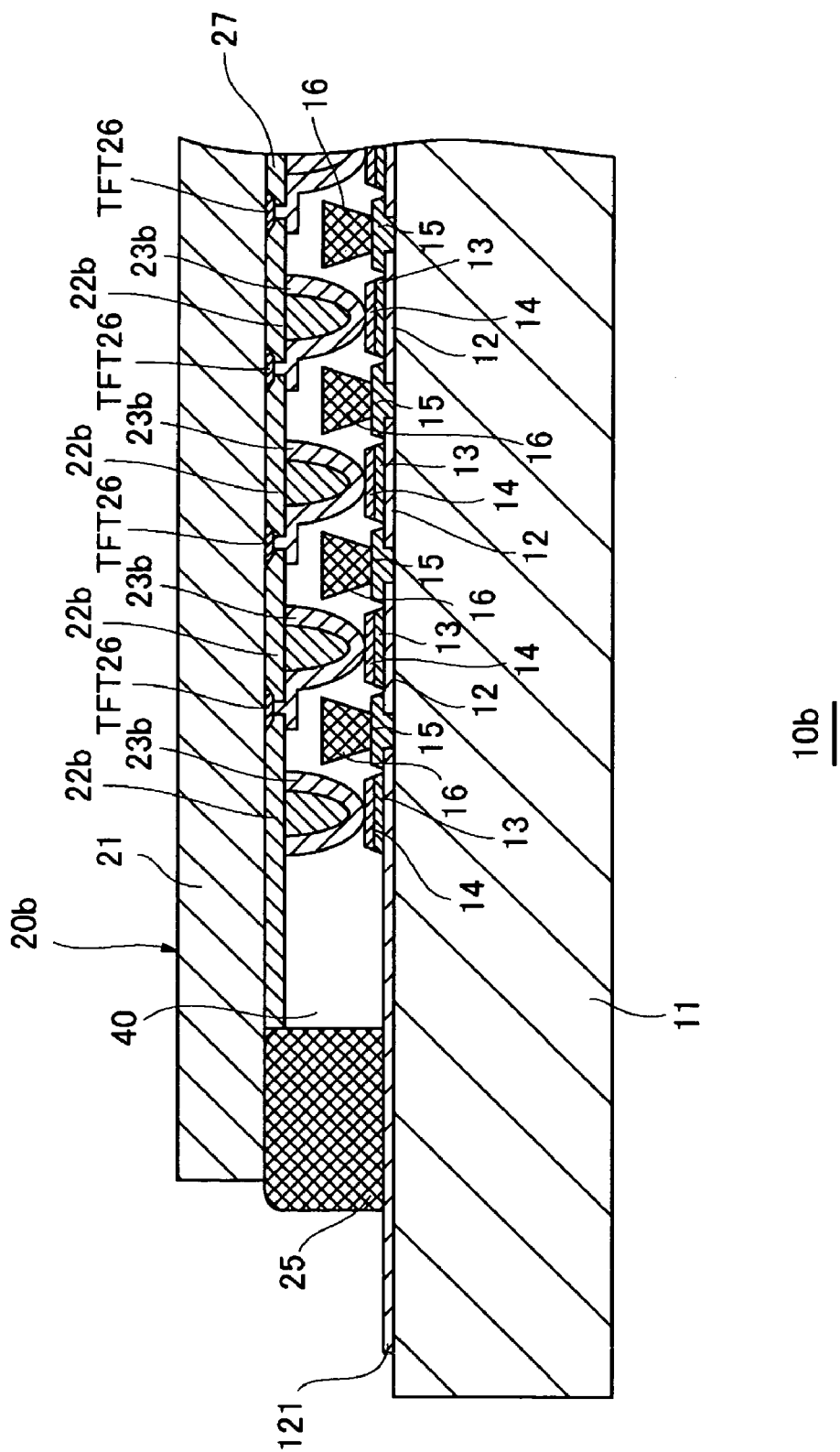

SELF-EMISSION PANEL AND METHOD OF FABRICATING THE SAME

BACKGROUND OF THE INVENTION

The present invention relates to a self-emission panel and a method of fabricating the same.

The present application claims priority from Japanese Application No. 2005-291353, the disclosure of which is incorporated herein by reference.

A self-emission panel 10J such as an organic EL (electroluminescent) panel includes one or more self-emission elements 1J, as shown in FIG. 1A. The self-emission element 1J has the structure that a lower electrode 12J is formed on a substrate 11J directly or through other layers, a deposition layer (luminescent functional layer) 13J is laminated on the lower electrode 12J, and an upper electrode 14J is formed on the deposition layer 13J. Electrons are injected from a cathode side formed on one of the lower electrode 12J and the upper electrode 14J, and holes are injected from an anode side formed on the other of the lower electrode 12J and the upper electrode 14J. The electrons and holes are recombined in the deposition layer 13J or the like for light emission. A conventional self-emission panel 10J is provided with a sealing member for sealing the self-emission elements 1J to protect the deposition layers 13J from moisture.

In a conventional passive driving type self-emission panel 10J, cathode lines (upper electrodes 14J) L1~Lm are formed in a lateral direction on a panel section 1b, and anode lines (lower electrodes 12J) A1~An are formed in a longitudinal direction, as shown in FIG. 1B. The self-emission elements 1J are formed on positions corresponding to intersections of the cathode lines L1~Lm and the anode lines (lower electrodes) A1~An. One end of the self-emission element 1J is connected with the cathode line, and the other end thereof is connected with the anode line. For instance, the cathode lines (upper electrodes) L1~Lm are connected with a scanning driver 1c, and the anode lines A1~An are connected with a data driver 1d. The scanning driver 1c and the data driver 1d are controlled by a control section 1e.

In recent years, the self-emission panels are required to lower their power consumption as the self-emission panels grow larger in size. Several techniques are known as a method for reducing the power consumption. For example, PCT International Application publication No. 2000-60907 discloses an organic electroluminescence display device in which auxiliary wiring layers are electrically connected with lower electrodes formed on a substrate.

It is, however, difficult to achieve the low power consumption of the self-emission panel in a larger size, even if the auxiliary wiring layers are formed on the lower electrodes to reduce the electrical resistance of the lower electrodes, as in the display device mentioned above. Therefore, it is required to achieve the low electrical resistance of upper electrodes.

When the electrical resistance of the upper electrodes is to be reduced simply by increasing the film thickness of the upper electrodes, there can be defective deposition including occurrence of microscopic projections called hillock, or the like.

The self-emission panel 10J having the large-size panel section 1b can have the following problem when the cathode lines (upper electrodes 14J) have high electrical resistance. As shown in FIG. 1C, the self-emission elements 1J of the panel section 1b adjacent to the scanning driver 1c are applied with a voltage VH. On the other hand, the self-emission elements 1J located farther from the scanning driver 1c are applied with less voltage due to voltage drop, resulting in a low voltage VL. For this reason, the large-size self-emission panel 10J can have an irregularity in an emission brightness, such as an emission brightness inclination. That is, the self-emission elements 1J closer to the scanning driver 1c have a higher emission brightness, while the self-emission elements 1J located farther from the scanning driver 1c have a lower emission brightness.

SUMMARY OF THE INVENTION

The present invention is to cope with the foregoing problems. An object of the present invention is to provide a self-emission panel capable of achieving low electrical resistance of upper electrodes using a simple configuration without increasing the film thicknesses of the upper electrodes, thereby providing a low-power consumption self-emission panel. Another object of the invention is to provide a method of fabricating a self-emission panel capable of achieving low electrical resistance of upper electrodes by a simple process.

To achieve the foregoing objects, the present invention shall include at least components set forth in the following aspects.

A self-emission panel according to one aspect of the present invention includes one or more self-emission elements, each of which has a first electrode formed on a substrate directly or through other layers, a deposition layer including a luminescent layer formed on the first electrode, and a second electrode formed on the deposition layer. The self-emission panel has an opposing substrate with protrusions formed toward the substrate on the side facing the substrate. Wiring patterns of auxiliary wirings are formed on the protrusions and electrically connected with the second electrodes.

A method of fabricating a self-emission panel according to another aspect of the present invention is one for fabricating a self-emission panel having one or more self-emission elements, each of which has a first electrode formed on a substrate directly or through other layers, a deposition layer including a luminescent layer formed on the first electrode, and a second electrode formed on the deposition layer. The self-emission panel has an opposing substrate with protrusions formed toward the substrate on the side facing the substrate. Wiring patterns of auxiliary wirings are formed on the protrusions of the opposing substrate and electrically connected with the second electrode.

A self-emission panel according to an embodiment of the present invention includes one or more self-emission elements, each of which has a first electrode formed on a substrate directly or through other layers, a deposition layer including a luminescent layer formed on the first electrode, and a second electrode formed on the deposition layer. The self-emission panel has an opposing substrate with protrusions formed toward the substrate on the side facing the substrate. Conductive layers are formed on the protrusions and electrically connected with the second electrodes.

In the self-emission panel configured as above, the conductive layers formed on the protrusions of the opposing substrate are electrically connected with the second electrodes formed on the substrate, so that the conductive layers function as auxiliary wirings for the second electrode. Therefore, the self-emission panel according to the present invention can achieve the lower electrical resistance of the second electrodes than a conventional self-emission panel.

When the electrical resistance is to be reduced simply by increasing the film thicknesses of the upper electrodes, there can be defective deposition such as hillock or the like. According to the self-emission panel of the present invention, it is possible to prevent such defective deposition and achieve the low electrical resistance of the second electrodes.

A method of fabricating a self-emission panel according to an embodiment of the present invention is one for fabricating a self-emission panel having one or more self-emission elements, each of which has a first electrode formed on a substrate directly or through other layers, a deposition layer including a luminescent layer formed on the first electrode, and a second electrode formed on the deposition layer. The self-emission panel has an opposing substrate with protrusions formed toward the substrate on the side facing the substrate. Conductive layers are formed on the protrusions of the opposing substrate and electrically connected with the second electrode.

According to the above-mentioned fabrication method, it is possible to achieve the low electrical resistance of the second electrodes by a simple process of forming the protrusions on the opposing substrate, forming the conductive layers on the protrusions, and electrically connecting the conductive layers with the second electrodes formed on the substrate.

BRIEF DESCRIPTION OF THE DRAWINGS

These and other objects and advantages of the present invention will become clear from the following description with reference to the accompanying drawings, wherein:

FIG. 1A illustrates a self-emission element; FIG. 1B illustrates a passive driving type self-emission panel; and FIG. 1C illustrates a drive voltage in the longitudinal direction of the self-emission panel shown in FIG. 1B;

FIG. 9 illustrates a self-emission panel according to a third embodiment of the present invention.

DETAILED DESCRIPTION OF THE PREFERRED EMBODIMENTS

Hereinafter, embodiments of the present invention will be described in detail with reference to the attached drawings.

First Embodiment

Figure 1A:
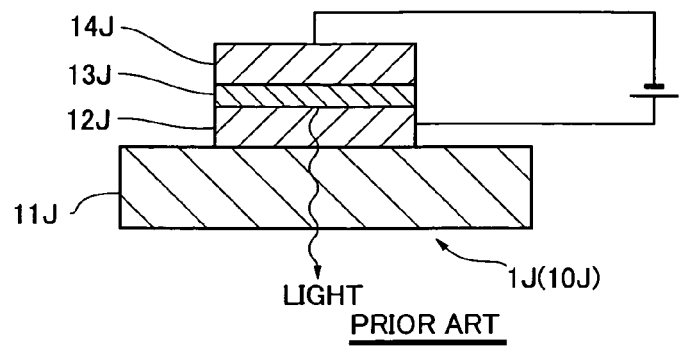
FIGS. 1A to 1C illustrate a conventional self-emission panel.
Figure 1B:
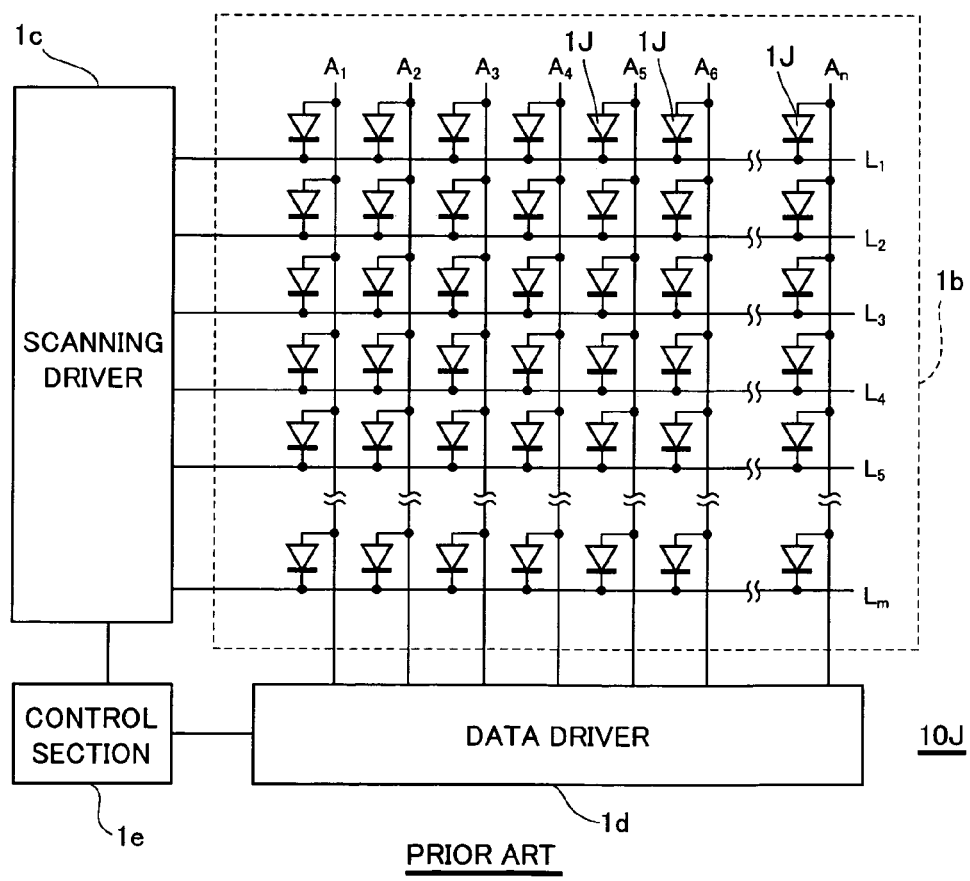
Figure 1C:
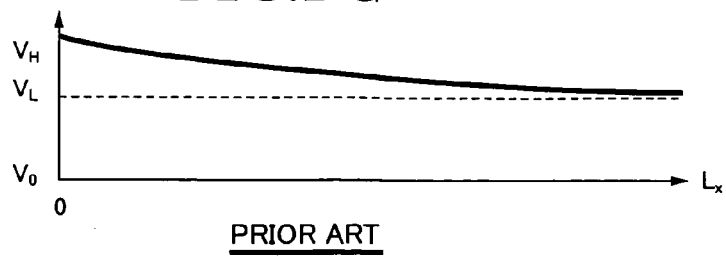
Figure 2:
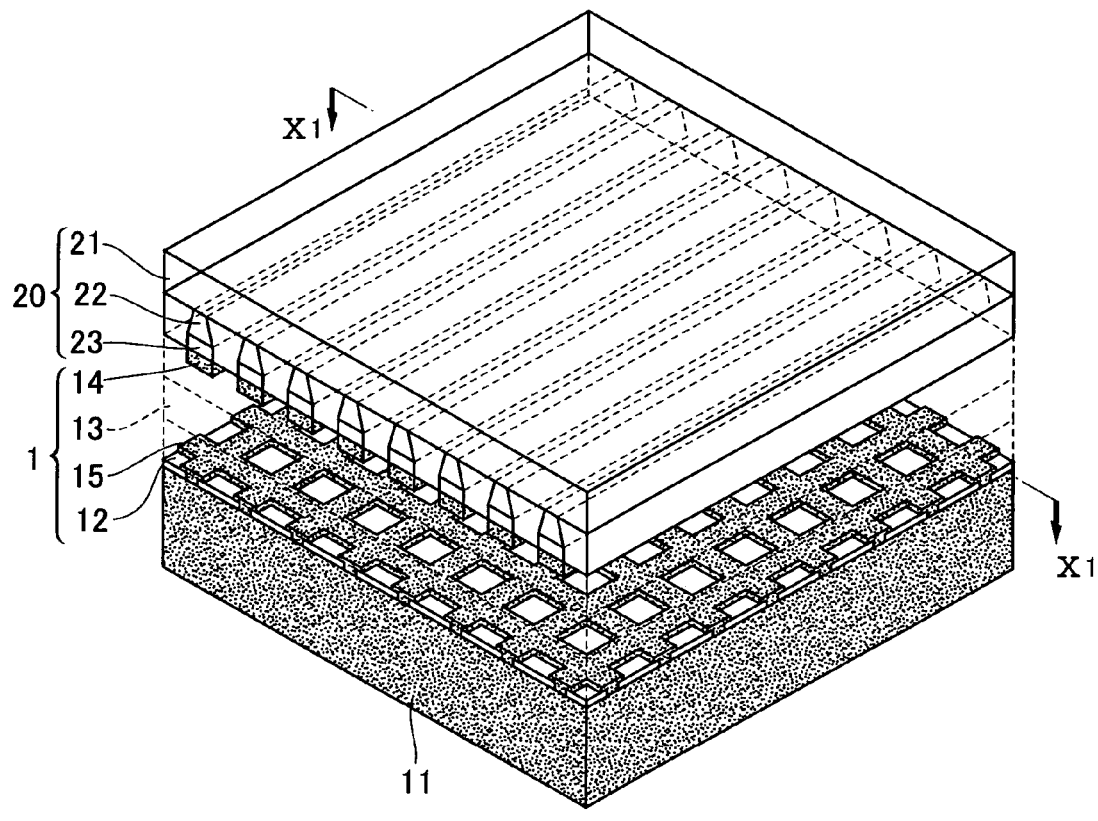
FIG. 2 is a schematic perspective view illustrating the self-emission panel according to a first embodiment of the present invention.
Figure 3:
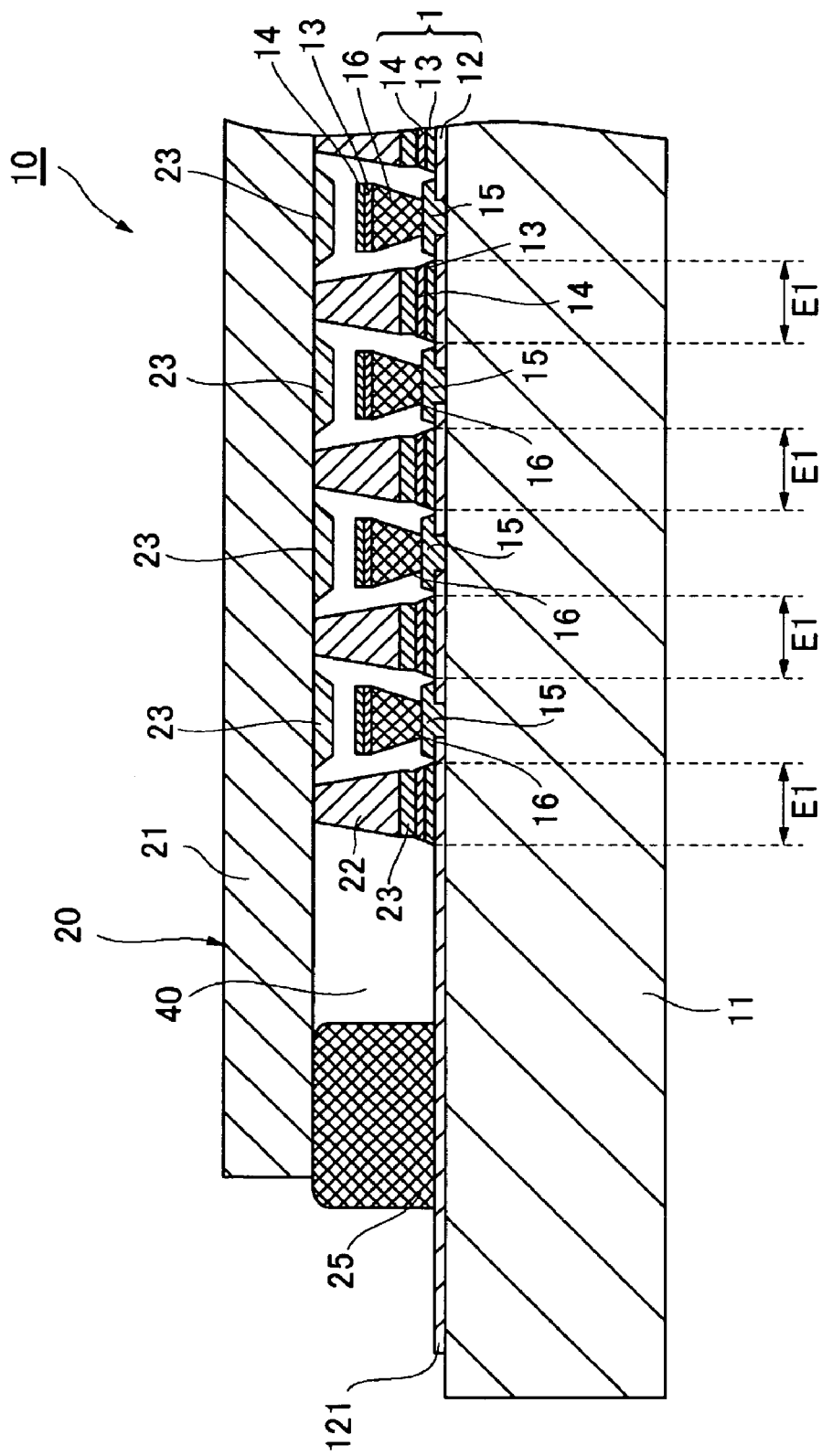
FIG. 3 is a sectional view taken along the line X1-X1 of the self-emission panel shown in FIG. 2.

FIG. 2 is a perspective view illustrating a self-emission panel according to the first embodiment of the present invention. FIG. 3 is a sectional view taken along the line X1-X1 of the self-emission panel shown in FIG. 2. Next, description will be given to a passive driving type bottom emission organic EL panel, which uses the self-emission panel 10 according to the first embodiment of the present invention. The self-emission panel of the present invention, however, is not limited to this configuration. In fact, the self-emission panel of the present invention can also be applied to various types of self-emission panels such as an active driving type, a top-emission type, or the like.

As shown in FIGS. 2 and 3, a self-emission panel 10 according to the present embodiment includes one or more self-emission elements 1, each of which has a first electrode (lower electrode) 12 formed on a substrate (support substrate) 11 directly or through other layers, a deposition layer (luminescent functional layer) 13 containing a luminescent layer formed on the first electrode (lower electrode) 12, and a second electrode (upper electrode) 14 formed on the deposition layer 13. A sectioning layer (insulation layer) 15 for sectioning luminescent areas E1 is formed on the lower electrodes 12, and ramparts (cathode seperators) 16 are formed on the insulation layer 15.

A sealing member 20 is arranged through an adhesive member 25 on the deposition layer formation side of the substrate 11, in order to seal the self-emission elements 1 tightly within a sealing space 40. The sealing member 20 includes an opposing substrate (sealing substrate) 21 with protrusions 22 formed toward the substrate 11 on the side facing the substrate 11. The protrusions 22 are made of an insulating material, or the like. Conductive layers 23 are formed on the protrusions 22 to be electrically connected with the upper electrodes 14 and function as auxiliary wirings. The conductive layers 23 have lower electrical resistance than the upper electrodes 14.

The conductive layers 23 of the present embodiment are arranged on the luminescent areas E1 of the self-emission elements 1. Specifically, as shown in FIG. 3, the conductive layers 23 formed on the protrusions 22 are at least arranged on the upper electrodes 14 within the luminescent areas E1 sectioned by the sectioning layer 15 so that the conductive layers 23 are electrically connected with the upper electrodes 14. If necessary, the sealing member 20 may be provided with a desiccating member within the sealing space 40 to reduce moisture that affects the self-emission elements 1. The sealing member 20 corresponds to an embodiment of an opposing substrate and sealing member according to the present invention, the protrusions 22 correspond to an embodiment of protrusions according to the present invention, and the conductive layers 23 correspond to an embodiment of conductive layers according to the present invention.

As shown in FIGS. 2 and 3, the protrusions 22 of the present embodiment are formed into inverted tapered shapes towards the substrate 11. For this reason, the predetermined conductive layers 23 serving as auxiliary wirings can be deposited on the inverted tapered protrusions 22 by a process of depositing a conductive material on the opposing substrate 21 where the protrusions 22 have been formed, by using an evaporation method or the like. That is, the inverted tapered protrusions 22 such as partition walls will function as dividing members for dividing the conductive layers 23. Such a process is simpler than an evaporation method using masks.

Figure 4:
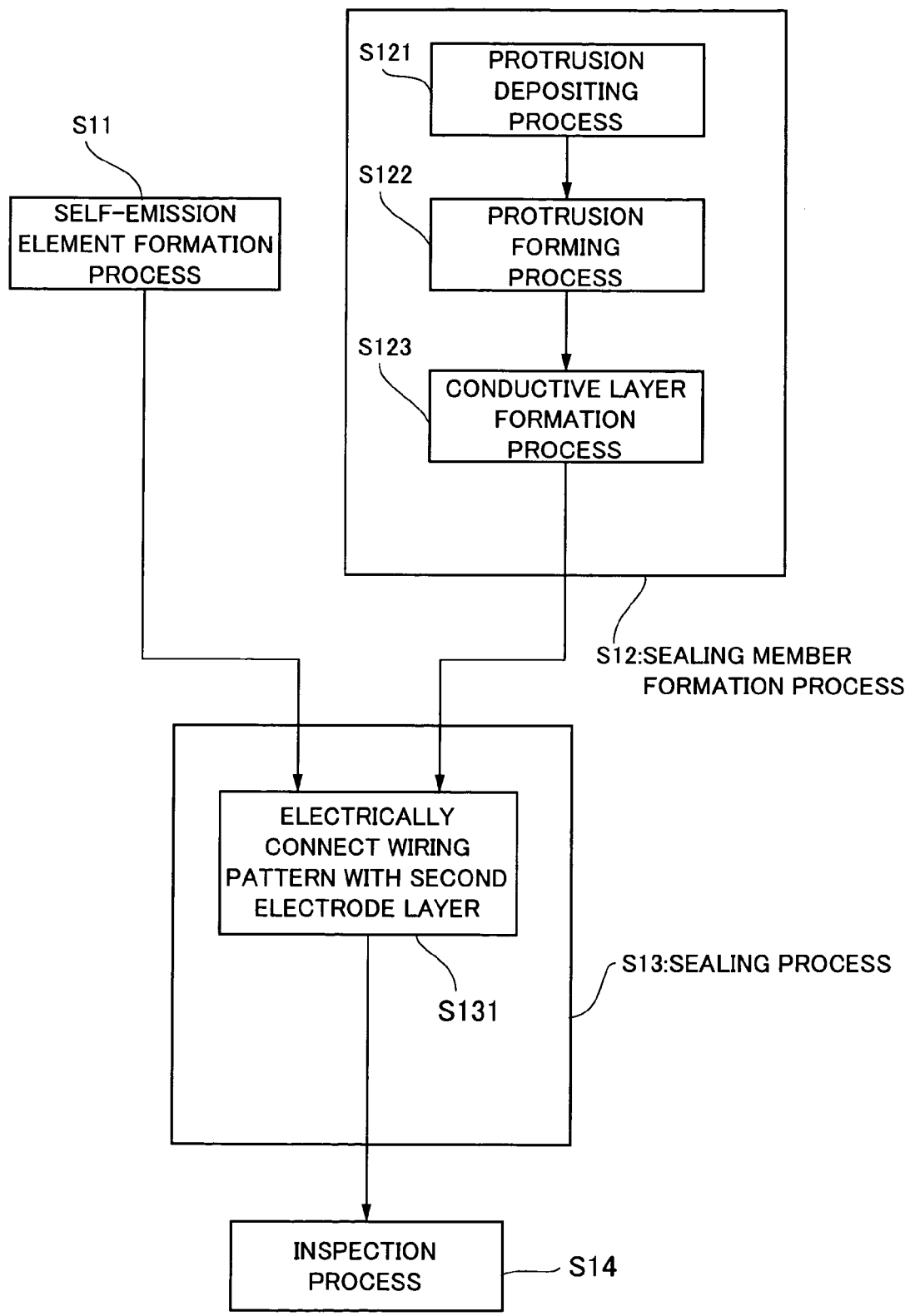
FIG. 4 is a flow chart for illustrating a method of fabricating the self-emission panel according to an embodiment of the present invention shown in FIG. 2.

FIG. 4 is a flow chart illustrating a method of fabricating the self-emission panel according to an embodiment of the present invention shown in FIG. 2. As shown in FIG. 4, the method of fabricating the self-emission panel 10 includes a self-emission element formation process S11 for forming the self-emission elements (organic EL elements) on the substrate 11, a sealing member formation process S12 for forming the opposing substrate (sealing member), a sealing process S13 for sealing the self-emission elements 1 formed on the substrate 11 by the sealing member 20 to obtain the self-emission panel 10, and an inspection process S14 for conducting various inspections in the self-emission panel 10.

Hereinafter, the processes will be explained respectively in detail with reference to the drawings.

FIGS. 5A to 5E illustrate the self-emission element forming process S11 shown in FIG. 4. The self-emission element forming process S11 will be explained with reference to FIGS. 5A to 5E.

Figure 5:
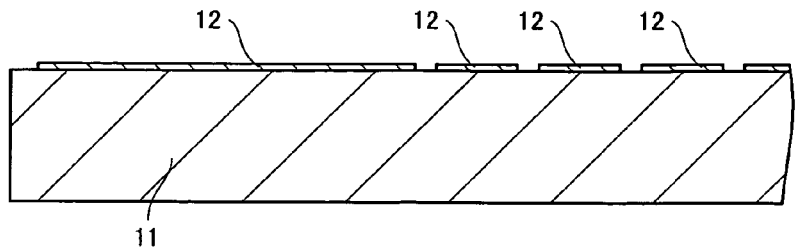
FIG. 5 illustrates a self-emission element forming process S11 shown in FIG. 4.
Figure 5:
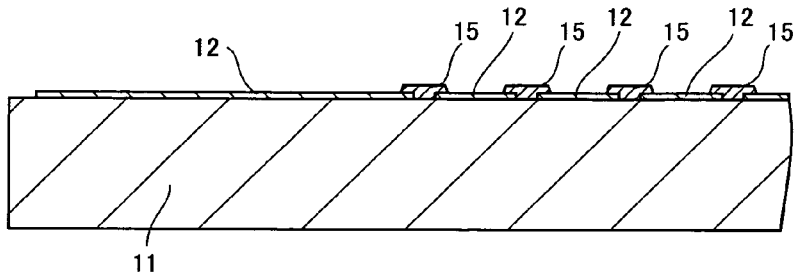
Figure 5:
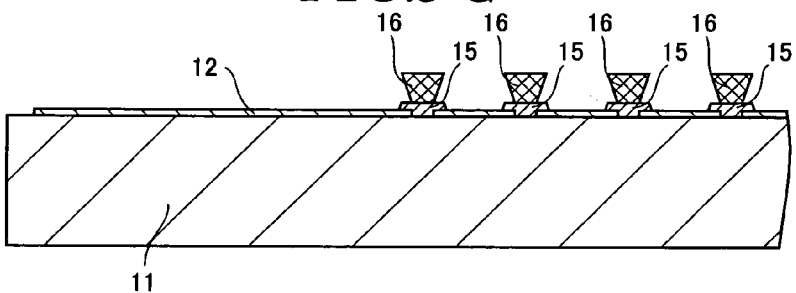
Figure 5:
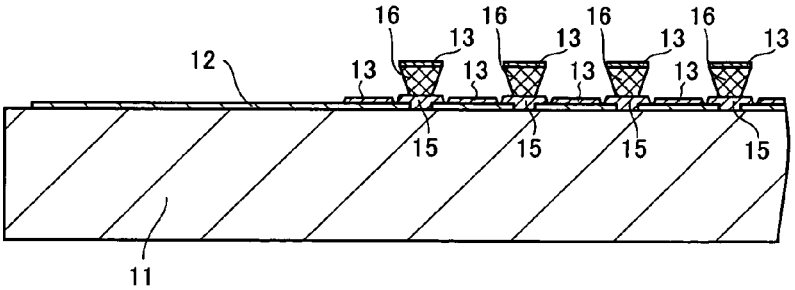
Figure 5:
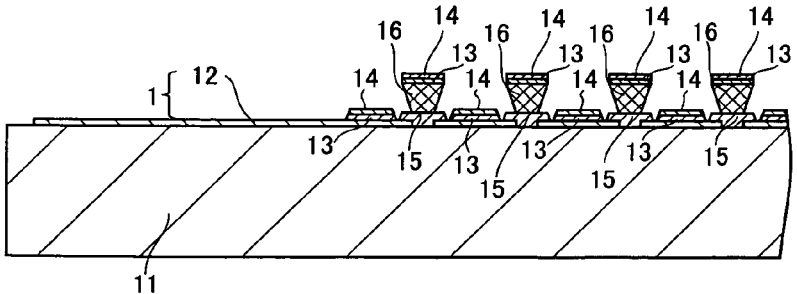

As shown in FIG. 5A, the lower electrodes 12 are deposited on the substrate 11 such as a transparent substrate or the like by a predetermined deposition method such as sputtering. Then, as shown in FIG. 5B, the sectioning layer (insulation layer) 15 is formed by patterning using a prescribed method such as photolithography. As shown in FIG. 5C, the inverted tapered ramparts 16 are formed on the insulation layer 15 by an insulating material using a prescribed method. As shown in FIG. 5D, the deposition layer (luminescent functional layer) 13 is formed by successively depositing a hole injection layer, a hole transporting layer, a luminescent layer, an electron injection layer, or the like, and then the upper electrodes 14 are formed by a prescribed method such as a resistance heating method or the like, as shown in FIG. 5E.

Figure 6A:
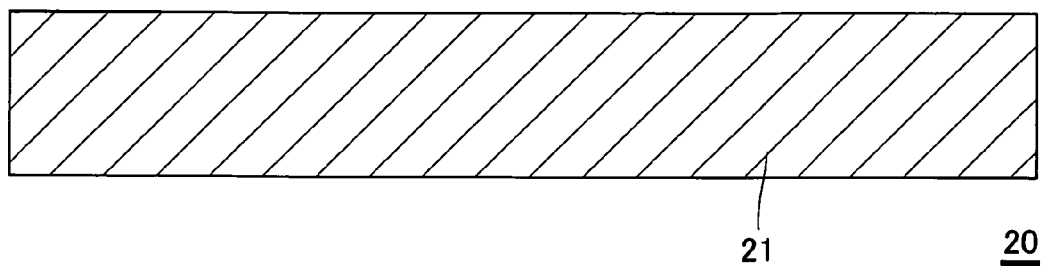
FIG. 6 illustrates a sealing member forming process S12 shown in FIG. 4.
Figure 6B:
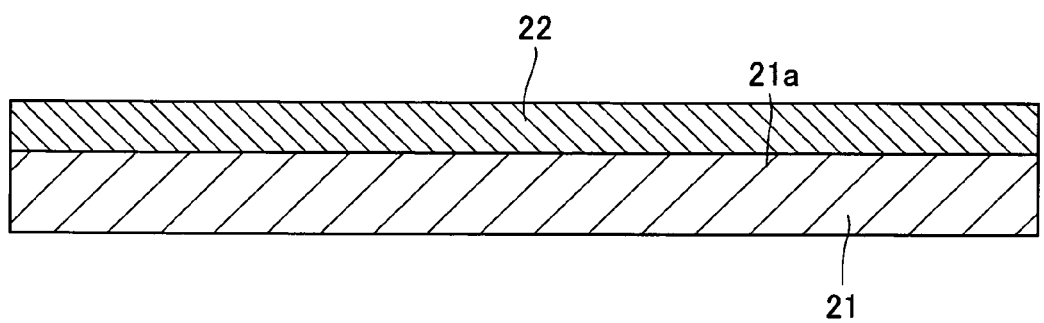
Figure 6C:
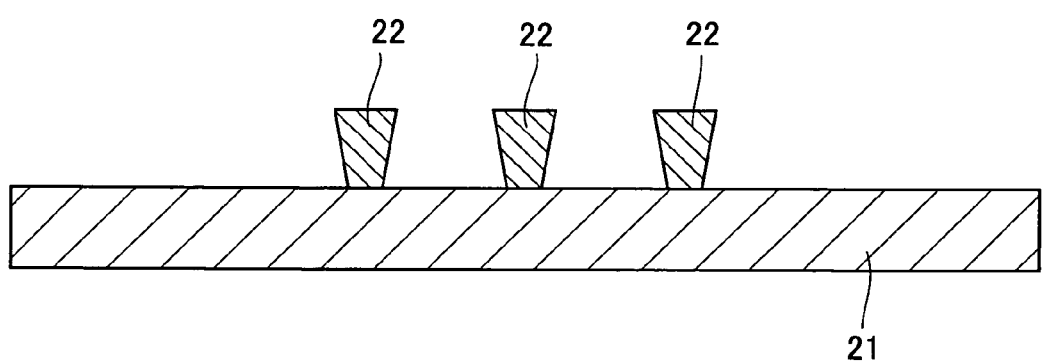

FIGS. 6A to 6D illustrate a sealing member formation process S12 shown in FIG. 4. As shown in FIGS. 6A and 6B, a layer for forming the protrusions 22 is formed on the substrate 21 by a resist material, an inorganic material, or the like by using a predetermined method such as spin-coating, evaporation, and sputtering (protrusion depositing process S121). As shown in FIG. 6C, the protrusions 22 are formed by predetermined patterning inside concave portions 21a of the substrate 21 by using a prescribed method such as sandblasting or etching (protrusion forming process S122). At this time, the protrusions 22 are formed into inverted tapered shapes. The protrusions 22 may be formed by the same method as the one used for forming the dividing walls 16, or by a prescribed method. Next, as in FIG. 6D, the conductive layers 23 are formed at least on the protrusions 22 by a prescribed method such as an evaporation method (conductive layer forming process S123).

As described above, the predetermined conductive layers 23 can be formed by the simple process of forming the protrusions 22 into inverted tapered shapes, and forming the conductive layers 23 on the protrusions 22 by an evaporation method or the like. The opposing substrate may be provided with concave portions for arranging desiccating members thereon.

Figure 7:
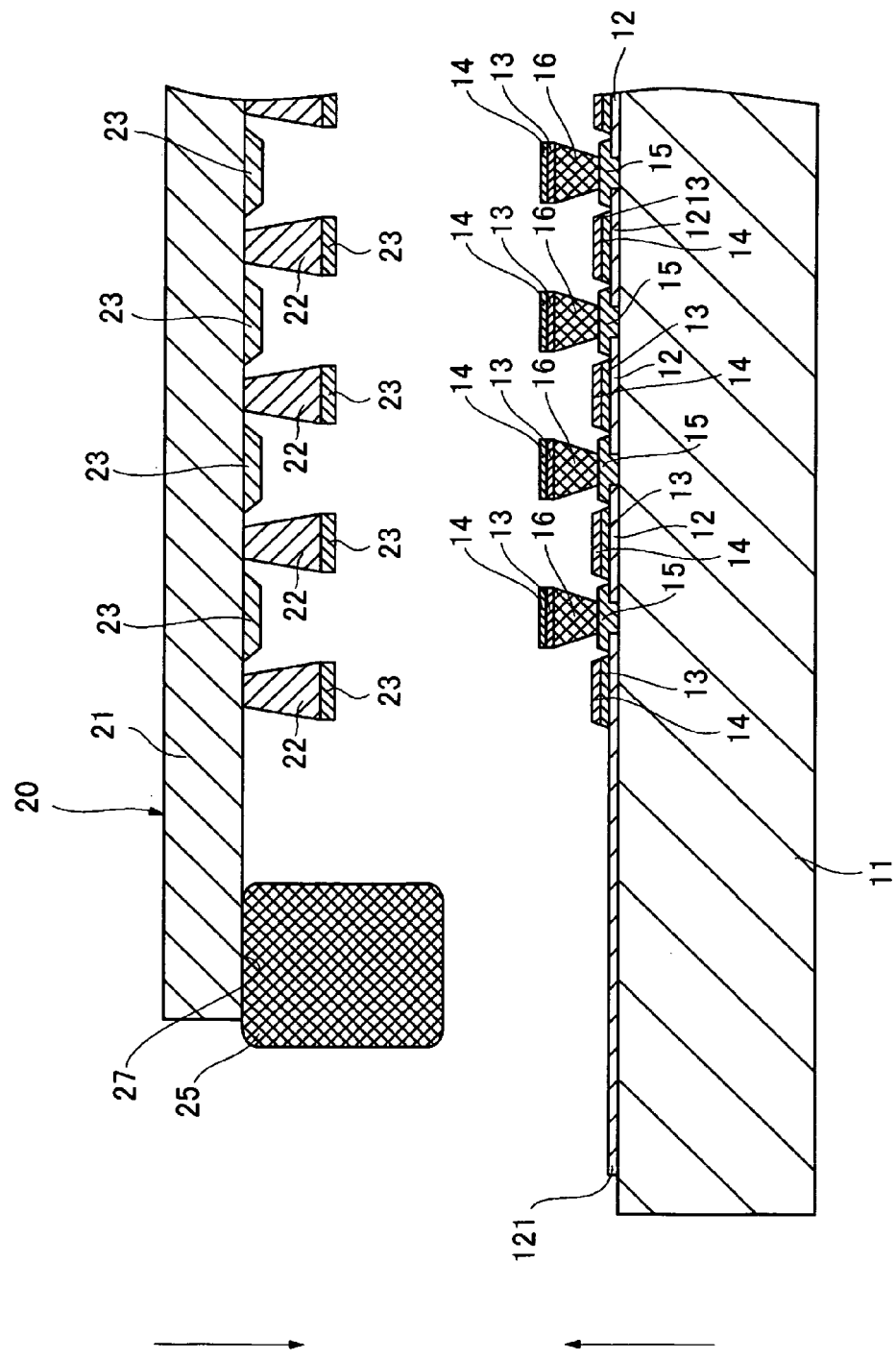
FIG. 7 illustrates a sealing process S13 shown in FIG. 4.

FIG. 7 illustrates a sealing process S13 shown in FIG. 4. As shown in FIG. 7, the substrate 11 having the self-emission elements 1 and the sealing member 20 having the protrusions 22 are aligned with each other in a chamber filled with an inert gas, and are bonded with each other through an adhesive member 25. At this time, the conductive layers 23 formed on the protrusions 22 are brought into contact with the upper electrodes 14 so that the upper electrodes 14 are electrically connected with the auxiliary wirings (S131). The self-emission panel 10 shown in FIG. 2 is formed by the above-mentioned process.

Next, inspections are conducted for the self-emission panel 10 formed by the above manufacturing process (S14). Various inspections are conducted, which include, for example, an inspection to see whether the upper electrodes 14 are electrically connected with the auxiliary wirings, or an inspection for emission brightness.

The self-emission panel 10 is manufactured by the above-mentioned process.

Example

Hereinafter, descriptions will be given to a specific example of the self-emission element manufacturing method according to an embodiment of the present invention. The present example includes the steps of forming the self-emission elements 1 on the substrate 11, and sealing the self-emission elements 1 by the sealing member 20 so as to form the self-emission panel (organic EL panel) 10.

Specifically, as shown in FIG. 5A, ITO (Indium Tin Oxide) is formed into a film having a thickness of approximately 110 nm on the glass substrate 11 in a sputtering apparatus. A photoresist is used to form the lower electrodes 12, and the ITO electrodes (lower electrodes) 12 are formed by patterning the photoresist into stripes by means of photolithography.

As shown in FIG. 5B, the sectioning layer (insulation layer) 15 is formed on the substrate 11 on which the ITO electrodes (lower electrodes, anodes) have been formed. Specifically, a positive resist material having high electrical insulation is applied to the lower electrodes 12, and is formed into film by spin-coating. Afterwards, the substrate 11 is heated at about 100° C. for approximately 80 seconds for solvent evaporation. Then, in an exposure apparatus, the resultant is exposed using a photomask under an irradiation condition of approximately 50 mJ/cm$^2$. Next, the resultant is developed in an aqueous alkali solution, and heated at approximately 300° C. in a thermo-hygrostat chamber so as to form the patterned sectioning layer 15 (insulation layer 1). As shown in FIG. 5C, the inverted tapered ramparts 16 (insulation layer 2) are formed by a prescribed method, and a cleaning process is applied to the substrate 11 formed with the ramparts, using UV (Ultraviolet rays) or ozone irradiation, for example.

After the above-mentioned heat treatment, the substrate 11 is put into a vacuum chamber. As shown in FIG. 5D, the deposition layers (luminescent functional layers) 13 including the luminescent layers are deposited successively in the vacuum chamber. Specifically, a hole injection layer, a hole transporting layer, a luminescent layer, and an electron injection layer are laminated on the substrate 11 in the vacuum chamber by resistance heating evaporation. For example, the hole injection layer is made of copper phthalocyanine (CuPc) in a thickness of approximately 25 nm. The hole transporting layer is made of naphthyldiamine ($\alpha$-NPD) in a thickness of approximately 45 nm. The luminescent layer is made of Alq3 (tris(8-hydroxyquinoline) aluminum) in a thickness of approximately 60 nm. The electron injection layer is made of lithium fluoride (LiF) in a thickness of approximately 0.5 nm. As shown in FIG. 5E, a conductive material such as aluminum is formed into a film having a thickness of approximately 100 nm at a rate of 1 nm/sec within deposition areas of the deposition layers (luminescent functional layers) 13 by resistance heating evaporation in the vacuum chamber so as to form the upper electrodes (cathodes) 14.

The self-emission elements (organic EL elements) 1 are formed on the substrate 11 by the above-mentioned process.

Next, the sealing member 20 is formed, which has the conductive layers 23 formed on the protrusions 22.

As shown in FIG. 6A, after the cleaning process is performed on the substrate 21, the opposing substrate (sealing substrate) 21 made of glass or the like is coated with a photosensitive material (such as ZPN1100, or the like) for forming an inverted tapered shape so as to form a film by a predetermined method such as spin-coating. After the film is formed on the substrate 21, the substrate 21 is heated at approximately 110° C. for about 90 seconds so as to evaporate unwanted solvent. The resultant is then exposed using a photomask under an irradiation condition of approximately 90 mJ/cm$^2$. The exposed substrate 21 is heated at approximately 110° C. for about 60 seconds. The resultant is developed in an aqueous alkali solution. Then, the aqueous alkali solution is washed off the substrate 21 by pure water, and the substrate 21 is dried by a spin drying, or the like. By the above-mentioned process, the inverted tapered protrusions (ramparts, conductive layer separators) 22 are formed on the sealing member 20 as shown in FIG. 6C.

Figure 6D:
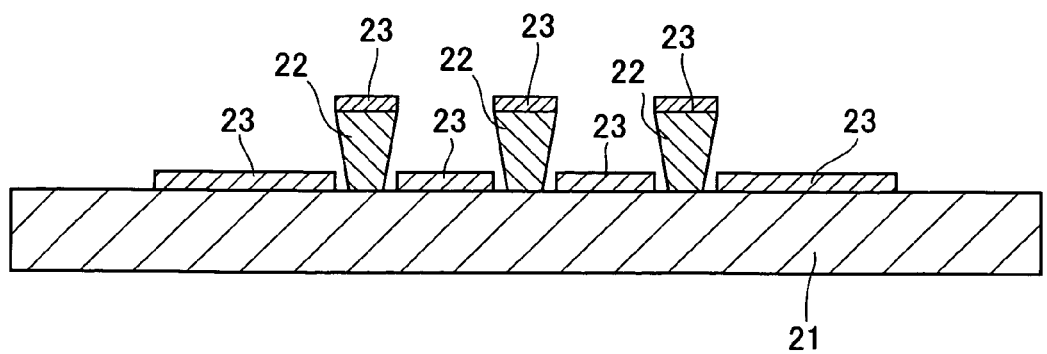

Next, as shown in FIG. 6D, a conductive material such as aluminum is formed into a film having a thickness of approximately 100 nm at a rate of 1 nm/sec by resistance heating evaporation in the vacuum chamber so as to form the conductive layers 23 on the protrusions 22.

The protrusions 22 and the conductive layers 23 are formed on the sealing member 20 by the above-mentioned process.

The substrate 11 formed with the self-emission elements 1 and the sealing member 20 formed with the protrusions 22 are put into a chamber filled with an inert gas such as nitrogen gas or the like. As shown in FIG. 7, an UV-setting adhesive member 25 for sealing is applied to a contacting portion 27 of the sealing member 20 which is to be in contact with the substrate 11. The substrate 11 and the sealing member 20 are bonded to each other through the adhesive member 25, followed by conducting an UV irradiation, so as to seal the self-emission elements 1. The conductive layers 23 formed on the protrusions 22 as auxiliary wirings are brought into contact with the upper electrodes 14, so that the upper electrode 14 and the conductive layers 23 are electrically connected.

The self-emission panel 10 shown in FIG. 2 is fabricated by the above process.

As described above, in the self-emission panel 10 according to the present embodiment, the sealing member 20 includes the opposing substrate (sealing substrate) 21 with the protrusions 22 formed towards the substrate 11 on the side facing the substrate 11. The conductive layers 23 are formed on the protrusions 22 to be electrically connected with the upper electrodes 14 of the self-emission element 1. It is, therefore, possible to achieve low electrical resistance of the upper electrodes 14 by using the simple configuration. Furthermore, the conductive layers 23 can be formed into a predetermined shape by the simple process of forming the protrusions 22 into inverted tapered shapes, and forming the conductive layers 23 on the protrusions 22 by an evaporation method or the like.

According to the self-emission panel 10 of the present invention, it is possible to reduce the power consumption of the self-emission panel 10 by lowering the wiring resistance of the upper electrode 14, even though the self-emission panel 10 grows larger in size.

When film thicknesses of the upper electrodes 14 is simply made thick to lower the electrical resistance of the upper electrodes 14, there can be defective deposition such as the occurrence of microscopic projections called hillock. According to the self-emission panel 10 of the present invention, since the conductive layers 23 are formed on the protrusions 22 of the sealing member 20, it is possible to prevent such defective deposition and achieve the low electrical resistance of the upper electrodes 14.

According to the self-emission panel 10 of the present invention, the self-emission panel 10 can be made thinner by setting the height of the protrusions 22 and the conductive layers 23 appropriately.

In the self-emission panel 10 of the present invention, it is possible to reduce an inclination of an emission brightness, which occurs in the self-emission elements 1 of the display panel, and to increase the emission brightness of the self-emission elements 1 by reducing the wiring resistance of the upper electrodes 14, even though the self-emission panel 10 is larger in size.

According to the self-emission panel 10 of the present invention, since the conductive layers 23 are formed on the protrusions 22, it is possible to simplify the manufacturing process and reduce costs, as compared to the case in which the conductive layers are formed directly between the opposing substrate 21 and the upper electrodes 14.

In the self-emission panel 10 of a bottom emission type, the auxiliary wirings can be arranged on the upper electrodes 14 having a reflex function, thereby ensuring that the wiring resistance of the upper electrodes 14 can be reduced more effectively than that of the lower electrodes 12.

According to the self-emission panel 10 of the present invention, heat generated on the deposition layers (luminescent functional layers) 13 is released through the upper electrodes 14 and the conductive layers 23, so that the self-emission panel 10 release the heat more efficiently than a conventional self-emission panel.

In the self-emission panel 10 of the present invention, since the sealing member 20 is provided with the protrusions 22 and the conductive layers 23, the sealing member 20 can have an increased strength against external pressure or the like, as compared with conventional sealing members, thereby increasing the strength of the whole self-emission panel 10.

The above-mentioned protrusion 22 may be made hollow or elastic in its structure so that the protrusion 22 can have flexibility to absorb impacts by external pressures or the like, thereby reducing the damage on the self-emission elements 1.

Second Embodiment

Figure 8:
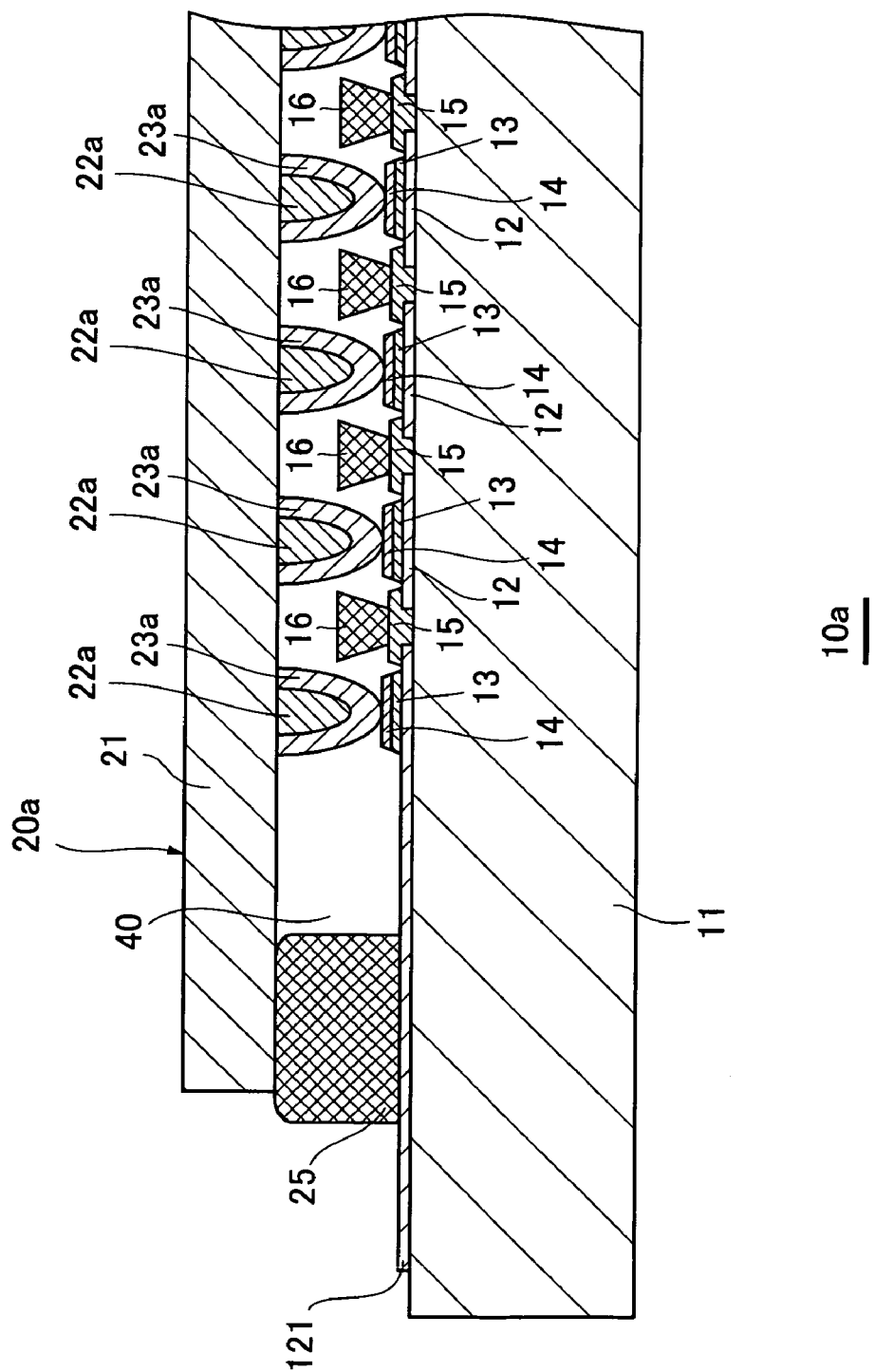
FIG. 8 illustrates a self-emission panel according to a second embodiment of the present invention.

FIG. 8 illustrates a self-emission panel according to the second embodiment of the present invention. Descriptions will be partially omitted as to the same parts as those in the first embodiment.

In a self-emission panel 10a according to the present embodiment, as shown in FIG. 8, a sealing member 20a includes an opposing substrate (sealing substrate) 21 with protrusions 22a formed towards the substrate 11 on the side facing the substrate 11.

As shown in FIG. 8, the protrusions 22a according to the present embodiment are formed into convex shapes. Conductive layers 23a are formed on the protrusions 22a to function as wiring patterns of the auxiliary wirings that are to be electrically connected with the upper electrodes 14. The conductive layers 23a are formed on the upper and side surfaces of the protrusions 22a.

The protrusions 22a and the conductive layers 23a of the sealing member 20a are formed by approximately the same method as the one used in the first embodiment.

In the sealing member 20a having the above-mentioned configuration, the protrusions 22a are tapered into convex shapes protruding towards the substrate 11, and have a larger width towards the opposing substrate 21, so as to ensure a higher strength against the external pressures or the like than the protrusions 22 having the inverted tapered shapes according to the first embodiment.

Because the conductive layers 23a are formed on the upper and side surfaces of the protrusions 22a, it is possible to more effectively reduce electrical resistance than the conductive layers 23 of the first embodiment.

For instance, the opposing substrate (sealing substrate) 21 is formed with the conductive layers or functional circuits such as driving circuits or the like on the side facing the substrate 11. The functional circuits are electrically connected with the conductive layers 23a formed on the side and upper surfaces of the protrusions 22a so that it is possible to fabricate the self-emission panel 10 provided with the functional circuits on the sealing member 20.

Third Embodiment

FIG. 9 illustrates a self-emission panel according to the third embodiment of the present invention. Descriptions will be partially omitted as to the same parts as those in the first and second embodiments.

A self-emission panel 10b according to the present embodiment is an active driving type, for example. As shown in FIG. 9, driving circuits are formed on the opposing substrate (sealing substrate) 21 of a sealing member 20b in the self-emission panel 10b. In particular, the self-emission panel 10b has the structure that TFTs (Thin film transistors) 26 are formed on the opposing substrate 21, a flattening layer 27 is formed on the TFTs 26, and protrusions 22b are formed on the flattening layer 27. Conductive layers 23b are formed on the upper and side surfaces of the protrusions 22b. The conductive layers 23b are electrically connected with the TFTs 26, and are formed to be in contact with the upper electrodes 14. That is, the opposing substrate 21 of the sealing member 20b is formed with the driving circuits on the side facing the substrate 11 for driving the self-emission elements 1b through the conductive layers 23b.

In the self-emission panel 10b according to the present embodiment as described above, the opposing substrate 21 of the sealing member 20b is formed with the driving circuits for driving the self-emission elements 1b through the conductive layers 23b formed on the protrusions 22b. For this reason, it is possible to make the substrate 11 thinner, so as to reduce the thickness of the whole self-emission panel 10b, as compared to a conventional active driving type self-emission panel in which TFTs are formed on the substrate 11.

According to the self-emission panel 10b of the present invention, the high-performance self-emission panel 10b can be obtained in a simple configuration, since the conductive layers 23b are formed on the protrusions 22b, and the conductive layers 23 are electrically connected with the TFTs 26.

It should be noted that the present invention is not limited to the embodiments described above. The embodiments may be combined with each other.

Hereinafter, a specific configuration will be explained with reference to FIGS. 3 and 4, taking an organic EL panel as a specific example of the above-mentioned self-emission panel.

a. Electrodes

Either one of the lower electrodes 12 and the upper electrodes 14 are set as cathode side, while the other is set as anode side. The anode side is formed by a material having a higher work function than the cathode side, using a transparent conductive film which may be a metal film such as chromium (Cr), molybdenum (Mo), nickel (Ni), and platinum (Pt), or films such as ITO and IZO. In contrast, the cathode side is formed by a material having a lower work function than the anode side, using a metal having a low work function, which may be an alkali metal (such as Li, Na, K, Rb, and Cs), an alkaline earth metal (such as Be, Mg, Ca, Sr, and Ba), a rare earth metal, an aluminum, a compound or an alloy containing two or more of the above elements, or an amorphous semiconductor such as a doped polyaniline and a doped polyphenylene vinylene, or an oxide such as $Cr_2O_3$, NiO, and $Mn_2O_5$.

Moreover, when the lower electrodes 12 and the upper electrodes 14 are all formed by transparent materials, it is allowed to provide a reflection film on one electrode side opposite to the light emission side.

A lead-out wiring portion 121 are connected with drive circuit parts driving the self-emission panel 10 or connected with a flexible wiring board. However, it is preferable for these lead-out wiring portions to be formed as having a low resistance as possible. Namely, the lead-out wiring portions can be formed by laminating low resistant metal electrode layers which may be Ag, Cr, Al, or their alloys. Alternatively, they may be formed by single one electrode of low resistant metal.

b. Deposition Layer

Although the deposition layer 13 comprises one or more deposition layers including at least one luminescent layer, its laminated structure can be in any desired arrangement. Usually, there is a laminated structure including, from the anode side towards the cathode side, a hole transporting layer, a luminescent layer, and an electron transporting layer. Each of the hole transporting layer, the luminescent layer, and the electron transporting layer can be in a single-layer or a multi-layered structure. Moreover, it is also possible to dispense with the hole transporting layer and/or the electron transporting layer. On the other hand, if necessary, it is allowed to insert other organic layers including a hole injection layer, and an electron injection layer. Here, the hole transporting layer, the luminescent layer, and the electron transporting layer can be formed by any conventional materials (it is allowed to use either a high molecular material or a low molecular material).

Regarding to a luminescent material for forming the luminescent layer, it is allowed to make use of a luminescence (fluorescence) obtained when the material returns from a singlet excited state to a base state or a luminescence (phosphorescence) obtained when it returns from a triplet excited state to a base state.

c. Sealing Member

In the self-emission panel 10, the sealing member 20 for tightly sealing the self-emission elements 1 may be a plate-like member or container-like member made of metal, glass, or plastic. Here, the sealing member may be an opposing substrate (sealing substrate) made of glass in a plate-like shape, or having a recess portion (a one-step recess or a two-step recess) formed by pressing, etching, or blasting, if necessary. Alternatively, the sealing member may be formed by using a flat glass plate capable of forming a sealing space 40 between the flat glass plate and the support substrate 11 by virtue of a spacer made of glass (or plastic). Further, it is also possible to employ an airtight sealing method which uses the above-described sealing member 20 to form a sealing space 40, or a solid sealing method in which a filling agent such as a resin or a silicon oil is sealed into the sealing space 40, for instance, a resin film and a metal foil are sealed into the sealing space 40, or a film sealing method in which the self-emission elements 1 are sealed up by a barrier film or the like.

d. Adhesive Agent

An adhesive agent forming the adhesive member 25 may be a thermal-setting type, a chemical-setting type (two-liquid mixture), or a light (ultraviolet) setting type, which can be formed by an acryl resin, an epoxy resin, a polyester, a polyolefine. Particularly, it is preferable to use an ultraviolet-setting epoxy resin adhesive agent which is quick to solidify without a heating treatment.

e. Desiccating Member

A desiccating member 30 may be a physical desiccating agent such as zeolite, silica gel, carbon, and carbon nanotube; a chemical desiccating agent such as alkali metal oxide, metal halide, chlorine dioxide; a desiccating agent formed by dissolving an organometal complex in a petroleum system solvent such as toluene, xylene, an aliphatic organic solvent and the like; and a desiccating agent formed by dispersing desiccating particles in a transparent binder such as polyethylene, polyisoprene, polyvinyl thinnate.

f. Various Types of Organic EL Panels

The self-emission panel 10 of the present invention can have various types without departing from the scope of the invention. For example, the light emission type of the self-emission panel 10 can be bottom emission type which emit light from the substrate 11 side, or top emission type which emit light from the sealing member 20 side (at this time, it is necessary for the sealing member 20 to be made of a transparent material). Multiphoton structures may also be employed. Moreover, the self-emission panel 10 may be a single color display or a multi-color display. In order to form a multi-color display, it is possible to adopt a discriminated painting method or a method in which an organic El panel including one or more organic EL elements having a single color (white or blue) luminescent is combined with a color conversion layer formed by a color filter or a fluorescent material (CF manner, CCM manner), a SOLED (transparent Stacked OLED) method in which two or more colors of unit display areas are laminated to form one unit display area, or a laser transfer method in which low molecular organic material having different luminescent colors are deposited in advance on to different films and then transferred to one substrate by virtue of thermal transfer using a laser. Besides, although the accompanying drawings show only a passive driving manner, it is also possible to adopt an active driving manner by adopting TFT substrate serving as support substrate 11, forming thereon a flattening layer and further forming the lower electrodes 12 on the flattening layer.

In the self-emission panel 10 according to the present invention, as described above, the sealing member 20 includes the opposing substrate (sealing substrate) 21 with the protrusions 22 formed towards the substrate 11 on the side facing the substrate 11. The conductive layers 23 are formed on the protrusions 22 to be electrically connected with the upper electrodes 14 of the self-emission element 1. For this reason, it is possible to achieve low electrical resistance of the upper electrodes 14 by the simple configuration without making film thicknesses of the upper electrodes 14 of the self-emission element 1 thick. It is also possible to prevent unevenness of emission brightness.

Furthermore, the conductive layers 23 can be formed into a predetermined shape by the simple process of forming the protrusions 22 into inverted tapered shapes, and forming the conductive layers 23 on the protrusions 22 by an evaporation method or the like.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A self-emission panel including one or more self-emission elements on a substrate, each of said self-emission elements comprising:
   a first electrode formed on the substrate directly or through other layers;
   a deposition layer including at least one luminescent layer formed on said first electrode; and
   a second electrode formed on said deposition layer, wherein:
   said self-emission panel has:
   tapered ramparts having a first taper direction;
   an opposing substrate having tapered protrusions having a second taper direction opposite to the first taper direction, said opposing substrate being provided on a side facing said substrate,
   said protrusions are formed of an insulating material, wherein:
   at least one conductive layer is formed in contact with each of said protrusions and electrically connected with said second electrode,
   said opposing substrate functions as a sealing member for sealing the self-emission elements formed on said substrate within a sealing space, and
   said conductive layer formed in contact with each of said protrusions is brought into contact with a second electrode, thereby allowing the conductive layer to be electrically connected to the second electrode.

2. The self-emission panel according to claim 1, wherein a sectioning layer is provided on said substrate for sectioning luminescent areas of said self-emission elements, and
   the ramparts are formed on the sectioning layer.

3. A method of manufacturing a self-emission panel including one or more self-emission elements, each of said self-emission elements having a first electrode formed on a substrate directly or through other layers, a deposition layer including a luminescent layer formed on said first electrode, and a second electrode formed on said deposition layer, the method comprising the steps of:
   forming tapered ramparts on said substrate, said tapered ramparts having a first taper direction;
   forming tapered protrusions on an opposing substrate facing said substrate, said tapered protrusions having a second taper direction opposite to the first taper direction and formed of an insulating material;
   forming conductive layers in contact with said protrusions of said opposing substrate; and
   bringing said conductive layers in contact with the second electrode, thereby allowing the conductive layers to be electrically connected to the second electrode.

4. The method of manufacturing the self-emission panel according to claim 3, where said self-emission elements formed on said substrate are sealed by said opposing substrate within a sealing space.

* * * * *